United States Patent
Baek et al.

(10) Patent No.: US 8,184,439 B2
(45) Date of Patent: May 22, 2012

(54) SEMICONDUCTOR MODULE

(75) Inventors: Joong-hyun Baek, Suwon-si (KR);
Hee-jin Lee, Seongnam-si (KR);
Jin-kwon Bae, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 12 days.

(21) Appl. No.: 12/833,470

(22) Filed: Jul. 9, 2010

(65) Prior Publication Data
US 2011/0032679 A1 Feb. 10, 2011

(30) Foreign Application Priority Data
Aug. 7, 2009 (KR) .................. 10-2009-0072740

(51) Int. Cl.
*H05K 7/20* (2006.01)

(52) U.S. Cl. .............. 361/715; 361/679.47; 361/679.54; 361/690; 361/704; 361/719; 257/713; 257/718; 174/16.3; 174/252; 165/80.3; 62/3.2

(58) Field of Classification Search ............ 361/679.46–679.54, 688, 689, 698, 699, 700–714, 717–727, 361/685, 679.31–679.34; 165/80.2, 80.3, 165/80.4, 80.5, 122–127, 104.14, 121, 104.33, 165/104.34, 185; 174/15.2, 16.3, 252; 62/3.2, 62/3.7, 3.3, 259.2; 29/832, 840–846, 890.03; 257/706–727
See application file for complete search history.

(56) References Cited

U.S. PATENT DOCUMENTS

| | | | | |
|---|---|---|---|---|
| 5,040,381 A | * | 8/1991 | Hazen | 62/3.2 |
| 5,637,921 A | * | 6/1997 | Burward-Hoy | 257/712 |
| 5,946,188 A | * | 8/1999 | Rochel et al. | 361/690 |
| 6,289,678 B1 | * | 9/2001 | Pandolfi | 62/3.2 |
| 6,415,612 B1 | * | 7/2002 | Pokharna et al. | 62/3.2 |
| 6,424,533 B1 | * | 7/2002 | Chu et al. | 361/719 |
| 6,434,000 B1 | * | 8/2002 | Pandolfi | 361/679.33 |
| 6,474,074 B2 | | 11/2002 | Ghoshal | |
| 6,525,934 B1 | * | 2/2003 | Nakanishi et al. | 361/679.47 |
| 6,686,532 B1 | * | 2/2004 | Macris | 136/204 |
| 6,880,346 B1 | * | 4/2005 | Tseng et al. | 62/3.7 |
| 7,703,291 B2 | * | 4/2010 | Bushnik et al. | 62/3.2 |
| 2004/0261988 A1 | * | 12/2004 | Sauciuc et al. | 165/185 |
| 2006/0156737 A1 | * | 7/2006 | Liu et al. | 62/3.2 |

FOREIGN PATENT DOCUMENTS
KR 10-2008-0027042 3/2010

* cited by examiner

*Primary Examiner* — Michail V Datskovskiy
(74) *Attorney, Agent, or Firm* — Harness, Dickey & Pierce, P.L.C.

(57) ABSTRACT

A semiconductor module includes a semiconductor package generating thermal energy, a heat collecting member transferring thermal energy from the semiconductor package to a heat collection area in the heat collecting member, a heat radiating member transferring thermal energy received from the heat collecting member and package to the outside, and a thermoelectric device transferring thermal energy through the heat collection area to the heat radiating member via the thermoelectric effect. The heat collecting member and heat radiating member may be otherwise insulated so thermal energy is transferred and controlled by the thermoelectric device. The package may be a dynamic random access memory (DRAM), microprocessor, central processing unit (CPU), graphic processing unit (GPU), or flash memory. The heat radiating member may be an external case of a solid state disk (SSD), and the thermoelectric device may be a Peltier cooler controlled through a power line.

16 Claims, 6 Drawing Sheets

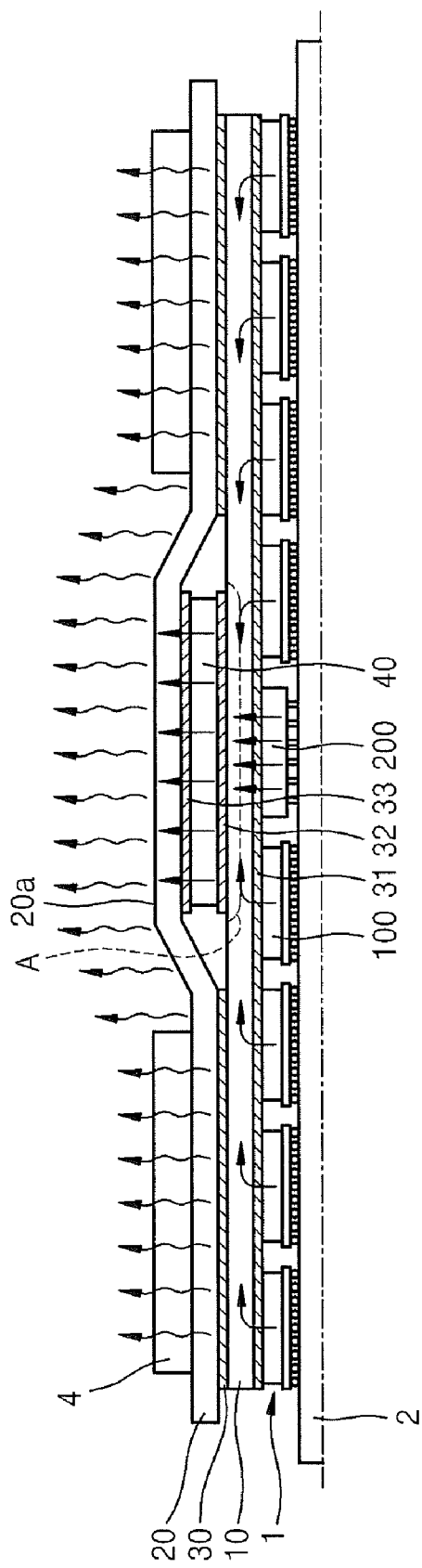

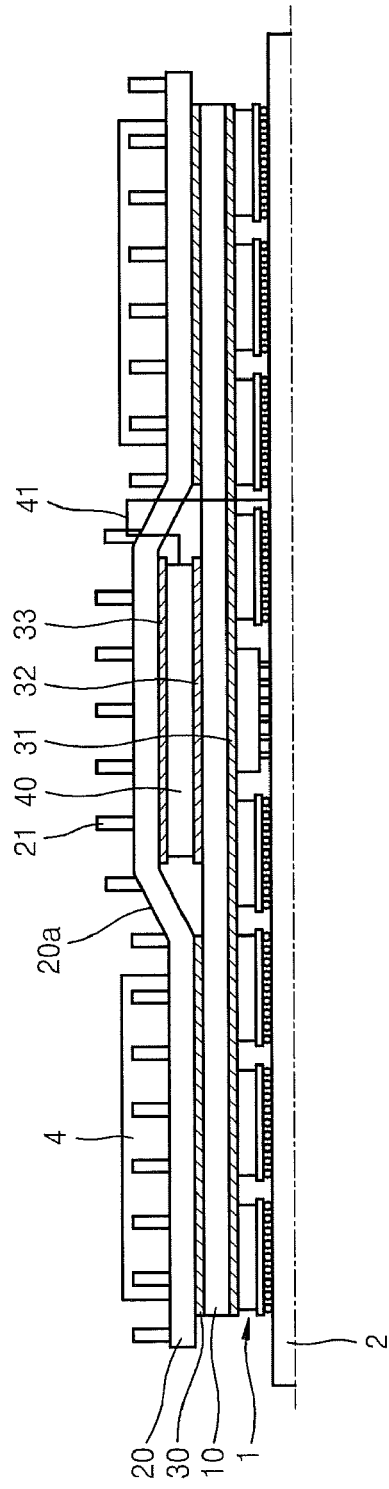
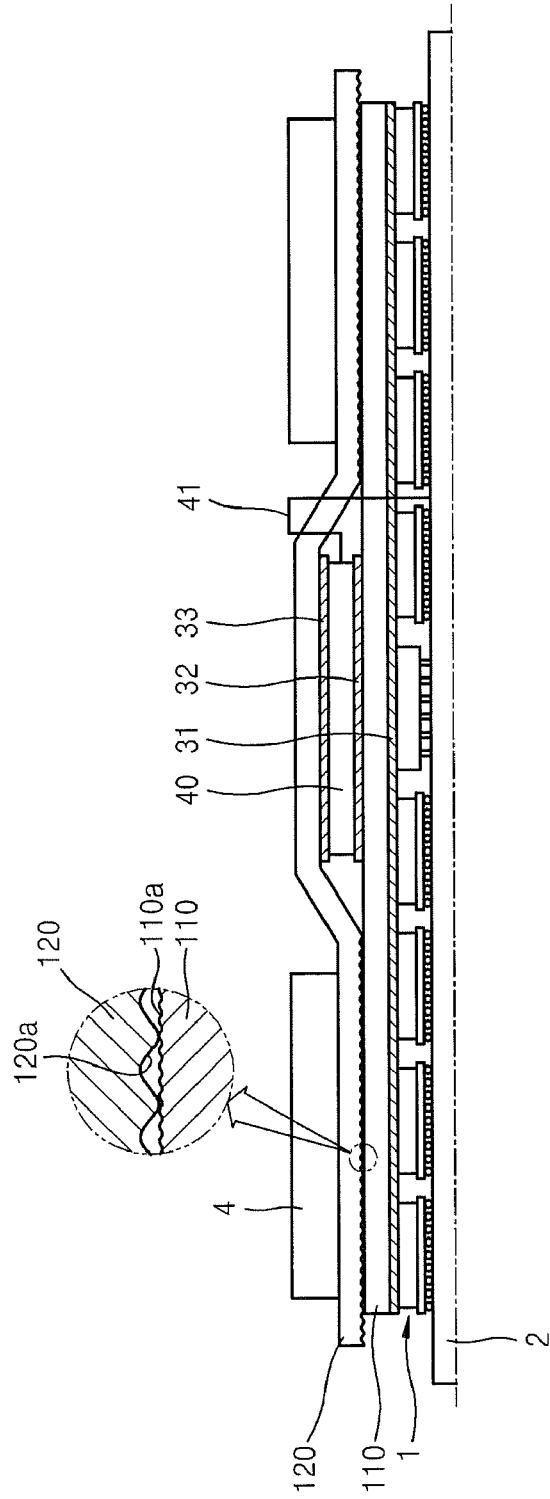

SEMICONDUCTOR MODULE

CROSS-REFERENCE TO RELATED APPLICATIONS

This application claims the benefit of Korean Patent Application No. 10-2009-0072740, filed on Aug. 7, 2009, in the Korean Intellectual Property Office (KIPO), the entire disclosure of which is incorporated herein by reference.

BACKGROUND

Inventive concepts of example embodiments relate to a semiconductor module capable of collecting heat generated in a semiconductor memory module or in a solid state disk (SSD) and efficiently radiating the heat by using a thermoelectric device, such as an active cooling device.

In general, a semiconductor chip is formed on a wafer via a semiconductor manufacturing process, separated from the wafer via a separate process, and manufactured as a semiconductor package via a packaging process.

The semiconductor package is mounted on a circuit board having a circuit pattern so as to be manufactured as a semiconductor module of various types including a memory device, a SSD or the like.

Semiconductor packages may be formed to have a ball grid array (BGA) package structure in which a solder ball, instead of a lead frame, is adhered to one surface of the semiconductor package for higher capacity, higher integration, and/or higher speed.

Also, in order to reduce or prevent heat emission due to the higher capacity, higher integration, and/or higher speed of the semiconductor package, a heat radiating device or a heat transfer member including a heat sink is used in the semiconductor package.

SUMMARY

Example embodiments include a semiconductor module including a semiconductor package generating thermal energy, a heat collecting member configured to transfer thermal energy from the semiconductor package to a heat collection area in the heat collecting member, a heat radiating member configured to transfer thermal energy received from the heat collecting member and package to the outside, and a thermoelectric device configured to transfer thermal energy through the heat collection area to the heat radiating member by using the thermoelectric effect. The package may be, for example, a dynamic random access memory (DRAM), a microprocessor, a central processing unit (CPU), a graphic processing unit (GPU), and/or a flash memory. Thermal interface materials improving thermal energy transfer may be between thermally-connected elements, and an insulative thermal barrier may be between insulated elements. Further, a surface of the heat collecting member contacting a surface of the heat radiating member may be a concave-convex surface of a certain roughness, and the surface of the heat radiating member contacting the surface of the heat collecting member may be a concave-convex surface of a different roughness. The heat radiating member may be an external case of a solid state disk (SSD), for example, and the thermoelectric device may be a Peltier cooler controlled through a power line.

Example methods include operating a semiconductor module including at least one semiconductor package, a heat collecting member, a heat radiating member, and a thermoelectric device between the heat collecting member and the heat radiating member, the method comprising supplying power to the thermoelectric device so as to transfer thermal energy from the heat collection member to the heat radiating member by the thermoelectric effect. The supplying power to the thermoelectric device includes varying the amount of power supplied to the thermoelectric device so as to vary a rate of thermal energy transfer from the heat collection member to the heat radiating member. The heat collecting member is thermally insulated from the heat radiating member except for a heat collection area in the heat collecting member, and the thermoelectric device is thermally connected between the heat collection area and the heat radiating member, and the supplying power to the thermoelectric device transfers thermal energy generated by the heat collection member to the heat radiating member by the thermoelectric effect through the heat collection area and the thermoelectric device.

BRIEF DESCRIPTION OF THE DRAWINGS

Example embodiments will be more clearly understood from the following detailed description taken in conjunction with the accompanying drawings in which:

FIG. 4 illustrates a heat radiation status of the example embodiment semiconductor module in FIG. 1;

FIG. 5 is a horizontal cross-sectional view of another example embodiment semiconductor module;

FIG. 6 is a horizontal cross-sectional view of another example embodiment semiconductor module;

DETAILED DESCRIPTION

Figure 1:
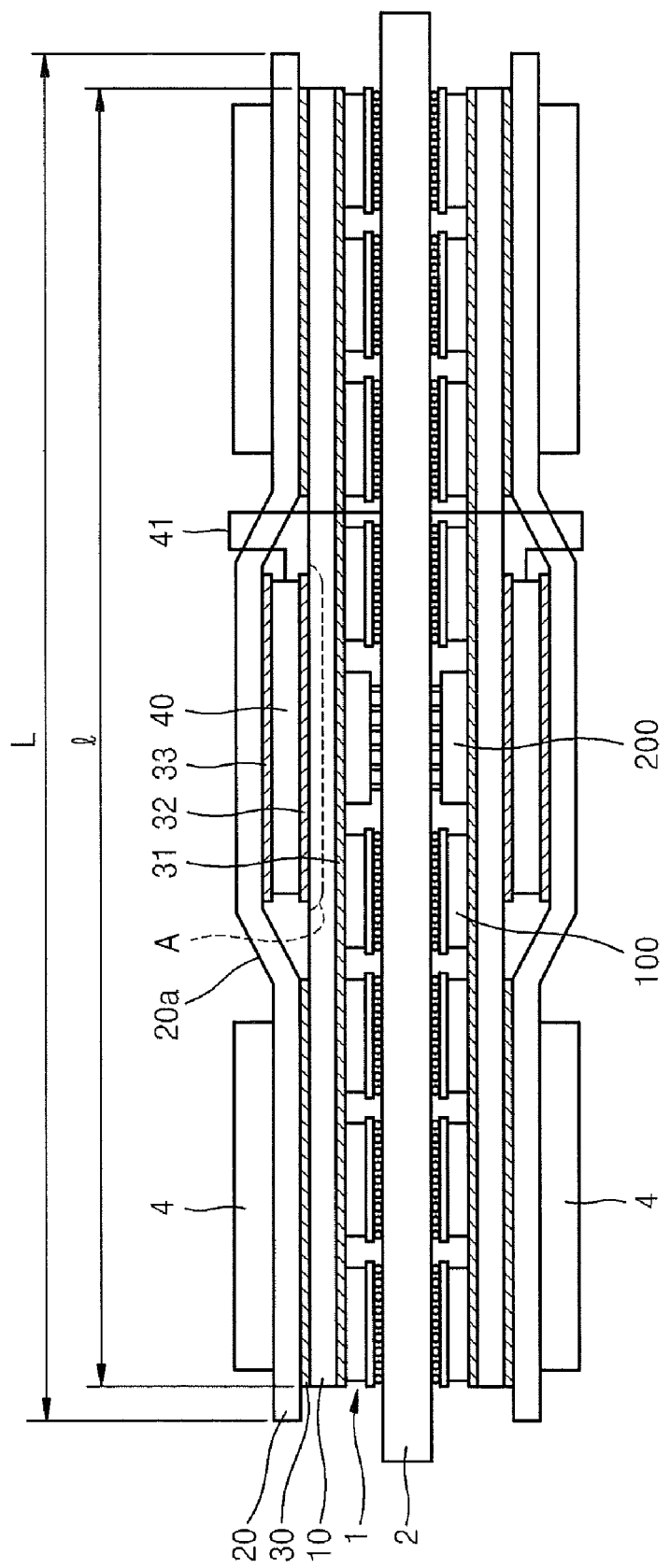
FIG. 1 is a horizontal cross-sectional view of an example embodiment semiconductor module.

Hereinafter, example embodiment semiconductor modules according to inventive concepts will be described in detail with reference to the attached drawings. However, specific structural and functional details disclosed herein are merely representative for purposes of describing example embodiments. The example embodiments may be embodied in many alternate forms and should not be construed as limited to only example embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected," "coupled," "mated," "attached," or "fixed" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

As used herein, the singular forms "a", "an" and "the" are intended to include the plural forms as well, unless the language explicitly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures or described in the specification. For example, two figures or steps shown in succession may in fact be executed substantially and concurrently or may sometimes be executed in the reverse order or repetitively, depending upon the functionality/acts involved.

Example embodiments will now be described with reference to the accompanying drawings, in which example embodiments of inventive concepts are shown. Like reference numerals in the drawings denote like elements.

Figure 2:
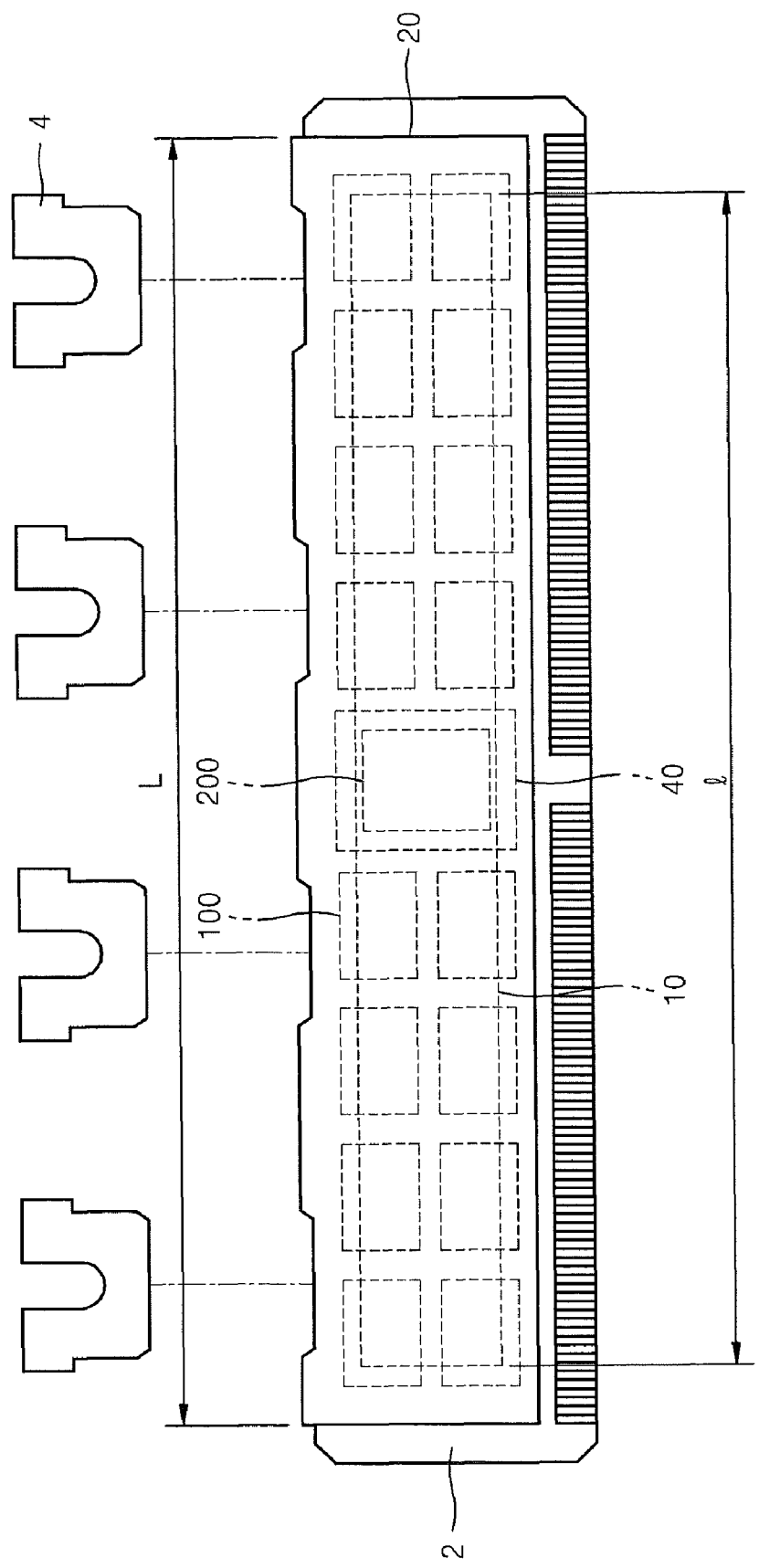
FIG. 2 is a front view of the example embodiment semiconductor module in FIG. 1.
Figure 3:
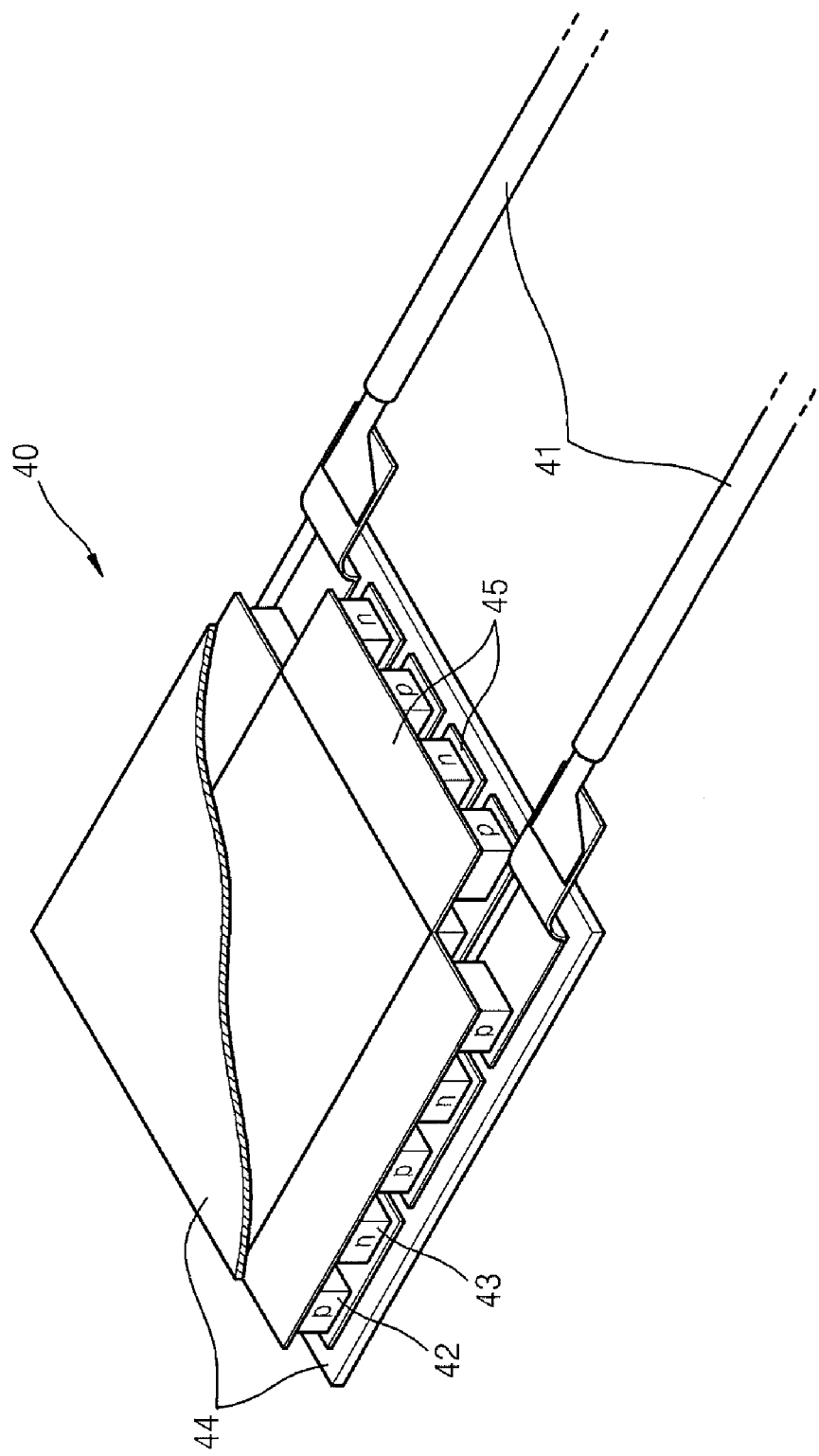
FIG. 3 is a perspective view of the example embodiment thermoelectric device in FIG. 1.

FIG. 1 is a horizontal cross-sectional view of an example embodiment semiconductor module according to inventive concepts. FIG. 2 is a front view of the semiconductor module in FIG. 1. FIG. 3 is a perspective view of a thermoelectric device in FIG. 1. FIG. 4 illustrates heat radiation in the semiconductor module in FIG. 1.

First, as illustrated in FIGS. 1 through 4, example embodiment semiconductor modules include semiconductor packages 1, a circuit board 2, a heat collecting member 10, a heat radiating member 20, a thermal barrier 30, and/or a thermoelectric device 40.

As illustrated in FIGS. 1 and 2, the semiconductor packages 1 are between a surface of the circuit board 2 and another surface opposite to the surface of the circuit board 2. For example, semiconductor packages 1 may correspond to a plurality of dynamic random access memories (DRAMs) 100 that are illustrated in FIGS. 1 and 2 and/or a microprocessor unit 200 that is formed on a center portion of the circuit board 2.

The DRAM 100 is a type of storage device for storing a large amount of information, and the microprocessor unit 200 has a logic circuit and is a type of processing device for processing stored information by using a series of programs.

Figure 7:
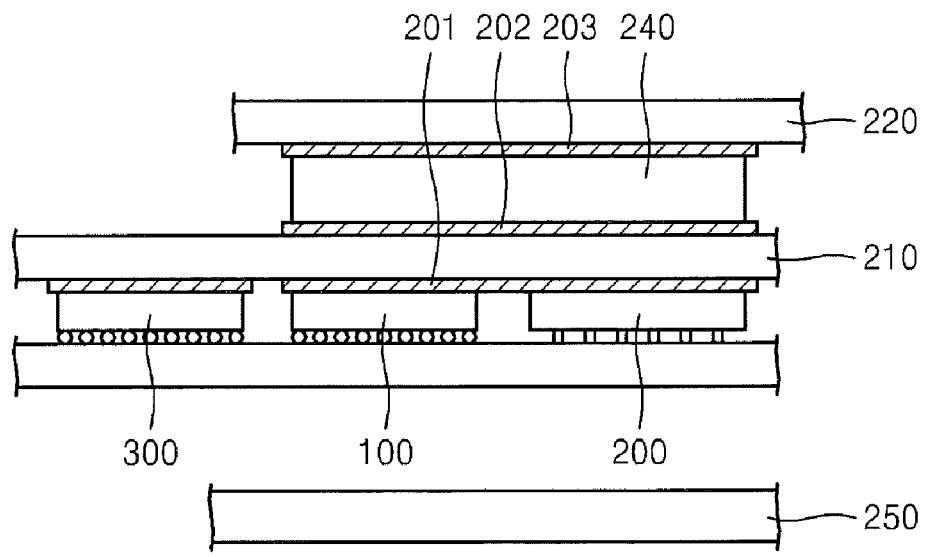
FIG. 7 is a horizontal cross-sectional view of a semiconductor module applied to a solid state disk (SSD), according to another embodiment of the inventive concept.
Figure 8:
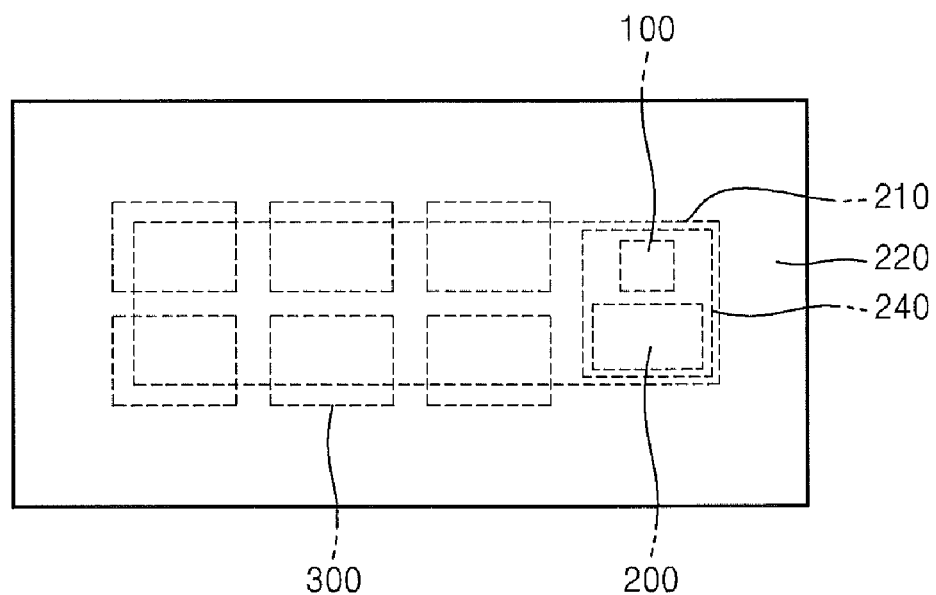
FIG. 8 is a front view of the semiconductor module of FIG. 7.

As illustrated in FIGS. 7 and 8, the semiconductor package 1 may include at least one flash memory 300, the DRAMs 100, and/or the microprocessor unit 200. Example embodiment semiconductor modules illustrated in FIGS. 7 and 8 may be referred to a solid state disk (SSD).

Despite these specific applications for semiconductor package 1, semiconductor package 1 may correspond to several other pieces of circuitry, such as a central processing unit (CPU) or a graphic processing unit (GPU), DRAM 100 and the microprocessor unit 200, and/or CPU or GPU, for example.

As illustrated in FIGS. 1 through 4, the semiconductor packages 1 are mounted on the circuit board 2 that electrically connects each of the semiconductor packages 1.

Heat collecting member 10 thermally contacts the semiconductor packages 1 and transfers heat generated in the semiconductor packages 1 to a heat collection area A. A thermal interface material (TIM) 31 may be between the semiconductor packages 1 and the heat collecting member 10 to enhance heat transfer to heat collecting member 10.

The heat collection area A may be at a center portion of the heat collecting member 10 so as to minimize a heat transfer path during heat transfer.

TIM 31 may be formed of various materials, including a thermal compound, a gap pad, a phase change material, and/or a liquid adhesive, for example.

Heat radiating member 20 has a heat radiation surface 20a exposed to the outside so as to radiate, or otherwise transfer, heat from the heat collection area A to the outside.

The heat collecting member 10 and/or the heat radiating member 20 may be formed of a material having higher thermal conductivity properties, such as a metal including aluminum, copper, etc.

As illustrated in FIGS. 1 and 2, in order to enlarge an area of the heat radiation surface 20a in a limited space, a length L of the heat radiating member 20 may be equal to or greater than a length l of the heat collecting member 10.

As illustrated in FIG. 5, in order to maximize a heat radiation and transfer area, a plurality of heat radiation pins 21 may be formed on the heat radiation surface 20a.

As illustrated in FIGS. 1 and 3, thermoelectric device 40 is between the heat collection area A of the heat collecting member 10 and the heat radiating member 20. Thermoelectric device 40 is a type of active cooler that absorbs heat from the heat collection area A by using the thermoelectric effect, and transfers the heat to the heat radiating member 20.

As illustrated in FIG. 3, the thermoelectric device 40 may be a Peltier device including top and bottom insulating substrates 44, a P-type thermoelectric material 42 and a N-type thermoelectric material 43 between the top and bottom insulating substrates 44, at least one substrate 45 electrically connecting the P-type thermoelectric material 42 and the N-type thermoelectric material 43, and a power line 41 for supplying power to the at least one substrate 45.

The Peltier device uses the Peltier effect by which electric energy is transformed to thermal energy, and since the Peltier effect is well known, a detailed description thereof is omitted here.

As illustrated in FIGS. 1 and 4, the power line 41 may be connected to the circuit board 2 so as to supply power to the thermoelectric device 40, or may be connected to a power line of a main board (not shown).

It is possible to maintain a constant cooling temperature by adjusting the power supplied to the thermoelectric device 40 by using a separate program or a CPU, for example.

The thermoelectric device 40 may be formed above the microprocessor unit 200, where an amount of heat emission is relatively greater.

TIMs 32 and 33 may be between the heat collecting member 10 and the thermoelectric device 40, and between the thermoelectric device 40 and the heat radiating member 20, respectively, so as to enhance heat transfer at these interfaces.

As illustrated in FIGS. 1 and 2, the heat collecting member 10 and the heat radiating member 20 may be pressurized by a clip 4 while having the thermoelectric device 40 therebetween, and thus may be fixed.

In the example embodiment semiconductor module, heat generated in the semiconductor packages 1 is collected by the heat collecting member 10, and the collected heat is transferred to the heat radiating member 20 by using the thermoelectric device 40. In order to require or increase heat to transfer from the heat collecting member 10 to the heat radiating member 20 through the thermoelectric device 40, the thermal barrier 30 may be formed between the heat collecting member 10 and the heat radiating member 20.

Thermal barrier 30 may be formed of a tape or a plating layer formed of various thermal insulative materials including, for example, an air layer, resin, silicon, etc, which have relatively low thermal conductivity. For example, thermal barrier 30 may have thermal conductivity coefficient k values are equal to or less than about 0.8 W/mK.

As illustrated in FIG. 6, in order to prevent or reduce heat transferred directly from the heat collecting member 10 to the heat radiating member 20, contact area between the heat collecting member 10 and the heat radiating member 20 may be minimized. For example, concave-convex surfaces 110a and 120a, which have non-matching roughness, may be formed on facing surfaces of the heat collecting member 10 and the heat radiating member 20.

As illustrated in FIG. 4, a cooling process in the semiconductor module may include heat that is generated in the semiconductor packages 1 being transferred to the heat collection area A of the heat collecting member 10.

Heat generated in the semiconductor packages 1 may be conducted to the heat collection area A of the heat collecting member 10 because heat collection area A may maintain a relatively low temperature state due to the thermoelectric device 40 transferring thermal energy from in the heat collection area A.

Thus, the heat generated in the semiconductor packages 1 may be more quickly transferred to the heat collection area A, and a flow of the heat may be controlled by a separate control unit (not shown) for controlling the thermoelectric device 40.

Heat collected in the heat collection area A is actively and rapidly transferred to the heat radiating member 20 by the thermoelectric device 40.

Since the thermal barrier 30 is between the heat collecting member 10 and the heat radiating member 20 but not between where heat collecting area A, thermoelectric device 40, and heat radiating member 20 thermally contact, it is possible to prevent heat from the heat collecting member 10 from being directly transferred to the heat radiating member 20 without passing through the thermoelectric device 40.

By actively controlling heat transfer from the heat collecting member 10 to the heat radiating member 20 substantially through the thermoelectric device 40, heat emission may be increased.

Heat transferred to the heat radiating member 20 may be transferred to the outside via air-cooling the heat radiation surface 20a.

FIG. 7 is a horizontal cross-sectional view of an example embodiment semiconductor module applied to a SSD. FIG. 8 is a front view of the semiconductor module of FIG. 7.

As illustrated in FIGS. 7 and 8, the example embodiment semiconductor module may use an upper external case 220 of the SSD as the heat radiating member 20 in FIG. 1 so as to cool semiconductor packages 1 including at least one DRAM 100, a microprocessor unit 200, and/or a flash memory 300 for a SSD.

As illustrated in FIG. 7, a thermoelectric device 240 thermally contacts with the upper external case 220 or a lower external case 250 via a TIM 203. A heat collecting member 210 thermally contacts with the thermoelectric device 240 via a TIM 202. The at least one DRAM 100, the microprocessor unit 200, and/or the flash memory 300 for a SSD thermally contact with the heat collecting member 210 via a TIM 201.

As illustrated in FIG. 7, heat that is generated in the at least one DRAM 100, the microprocessor unit 200, and the flash memory 300 for a SSD passes through the heat collecting member 210 and then is relatively quickly transferred to the upper external case 220 by the thermoelectric device 240 and dissipated to the outside via air-cooling.

As illustrated in FIG. 8, the thermoelectric device 240 may be formed above the DRAM 100 and the microprocessor unit 200, which may emit relatively more thermal energy than flash memory for SSD 300.

While inventive concepts have been shown and described with reference to example embodiments and methods using the same, the embodiments and terms should not be construed as limiting the scope of the following claims. Accordingly, it will be understood by those of ordinary skill in the art that various changes in form and details may be made therein without departing from the spirit and scope of the following claims.

What is claimed is:

1. A semiconductor module comprising:
    at least one semiconductor package;
    a heat collecting member thermally connected to the at least one semiconductor package, the heat collecting member configured to transfer thermal energy from the at least one semiconductor package to a heat collection area in the heat collecting member;
    a heat radiating member having a heat radiation surface exposed to an outside, the heat radiating member configured to transfer thermal energy from the heat collection area of the heat collecting member to the outside;
    a thermoelectric device between the heat collection area of the heat collecting member and the heat radiating member, the thermoelectric device configured to transfer thermal energy from the heat collection area to the heat radiating member by using the thermoelectric effect; and
    a thermal barrier between the heat collecting member and the heat radiating member.

2. The semiconductor module of claim 1, wherein the at least one semiconductor package includes at least one of a dynamic random access memory (DRAM), a microprocessor, a central processing unit (CPU), a graphic processing unit (GPU), and a flash memory.

3. The semiconductor module of claim 1, further comprising:
    a first thermal interface material (TIM) between the at least one semiconductor package and the heat collecting member;
    a second TIM between the heat collection area of the heat collecting member and the thermoelectric device; and
    a third TIM between the thermoelectric device and the heat radiating member.

4. The semiconductor module of claim 3, wherein the first TIM, the second TIM, and the third TIM include at least one of a thermal compound, a gap pad, a phase change material, and a liquid adhesive.

5. The semiconductor module of claim 1, wherein the thermal barrier includes at least one of a tape, a plating layer, an air layer, a resin, and a silicon material.

6. The semiconductor module of claim 1, wherein the thermal barrier is not between the heat collecting area and the heat radiating member or the thermoelectric device.

7. The semiconductor module of claim 1, wherein the heat radiating member and the heat collecting member are metallic.

8. The semiconductor module of claim 1, wherein a surface of the heat collecting member contacting a surface of the heat radiating member is a concave-convex surface of a first roughness, and wherein the surface of the heat radiating member contacting the surface of the heat collecting member is a concave-convex surface of a second roughness, and wherein the first and the second roughnesses are different.

9. The semiconductor module of claim 1, wherein a length of the heat radiating member is greater than a length of the heat collecting member.

10. The semiconductor module of claim 1, further comprising:
    at least one heat radiation pin on the heat radiation surface.

11. The semiconductor module of claim 1, wherein the heat radiating member is an external case of a solid state disk (SSD).

12. The semiconductor module of claim 1, wherein the heat collecting member and the heat radiating member are fixed to each other by a clip.

13. The semiconductor module of claim 1, wherein the thermoelectric device is a Peltier device including,
    a top insulating substrate and a bottom insulating substrate,
    a P-type thermoelectric material and a N-type thermoelectric material between the top and the bottom insulating substrates,
    at least one substrate electrically connecting the P-type and the N-type thermoelectric materials, and
    a power line supplying power to the at least one substrate.

14. The semiconductor module of claim 1, wherein the heat collection area is at a center portion of the heat collecting member.

15. The semiconductor module of claim 1, further comprising:
    a circuit board on which the at least one semiconductor package is mounted.

16. A semiconductor module comprising:
    at least one thermal energy source;
    a heat collecting layer thermally connected to the at least one thermal energy source, the heat collecting layer being thermally conductive, the heat collecting layer having a heat collecting area;
    a heat radiating layer exposed to an outside, the heat radiating layer being thermally conductive, the heat radiating layer being thermally insulated from the heat collecting layer except through the heat collecting area; and
    a thermoelectric device thermally connected between the heat collection area and the heat radiating member, the thermoelectric device configured to transfer thermal energy generated by the at least one thermal energy source through the heat collection area to the heat radiating member by using the thermoelectric effect.

* * * * *